United States Patent
Uraki et al.

(10) Patent No.: US 8,515,585 B2
(45) Date of Patent: Aug. 20, 2013

(54) AIR CONDITION CONTROL DEVICE AND CONTROLLING METHOD

(75) Inventors: Yasushi Uraki, Kawasaki (JP); Junichi Ishimine, Kawasaki (JP); Ikuro Nagamatsu, Kawasaki (JP); Masahiro Suzuki, Kawasaki (JP); Tadashi Katsui, Kawasaki (JP); Yuji Ohba, Kawasaki (JP); Nobuyoshi Yamaoka, Kawasaki (JP); Akira Ueda, Kawasaki (JP); Seiichi Saito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 289 days.

(21) Appl. No.: 12/878,385

(22) Filed: Sep. 9, 2010

(65) Prior Publication Data

US 2011/0071687 A1   Mar. 24, 2011

(30) Foreign Application Priority Data

Sep. 24, 2009   (JP) ................. 2009-219742

(51) Int. Cl.
*G06F 19/00* (2011.01)

(52) U.S. Cl.
USPC .......................................... 700/276; 236/49.3

(58) Field of Classification Search
USPC .............. 700/276, 277; 62/129, 179, 109.33, 62/259.2; 236/49.3, 51
See application file for complete search history.

(56) References Cited

U.S. PATENT DOCUMENTS

| | | | | |
|---|---|---|---|---|
| 5,271,453 | A | * | 12/1993 | Yoshida et al. ............... 165/205 |
| 5,291,748 | A | * | 3/1994 | Ueda ............................... 62/179 |
| 5,299,432 | A | * | 4/1994 | Nakae et al. ..................... 62/298 |
| 6,283,380 | B1 | * | 9/2001 | Nakanishi et al. ........... 236/49.3 |
| 6,745,579 | B2 | * | 6/2004 | Spinazzola et al. ................ 62/89 |
| 6,822,859 | B2 | * | 11/2004 | Coglitore et al. ........ 361/679.49 |
| 7,099,784 | B2 | | 8/2006 | Spitaels et al. |
| 7,214,131 | B2 | * | 5/2007 | Malone ......................... 454/184 |
| 2009/0198385 | A1 | | 8/2009 | Kazuichi et al. |
| 2010/0010678 | A1 | * | 1/2010 | Dawson et al. ............... 700/276 |

FOREIGN PATENT DOCUMENTS

| | | |
|---|---|---|
| JP | 2006-064254 A | 3/2006 |
| JP | 2006-118837 | 5/2006 |
| JP | 2007-328633 | 12/2007 |
| JP | 2009-159712 A | 7/2009 |

OTHER PUBLICATIONS

Office Action mailed Jun. 18, 2013 issued in corresponding JP Patent Application No. 2009-219742 (with English translation).

* cited by examiner

*Primary Examiner* — Kidest Bahta
(74) *Attorney, Agent, or Firm* — Squire Sanders (US) LLP

(57) ABSTRACT

An air condition control device for controlling a plurality of air conditioners which cool a plurality of electronic apparatuses respectively, the air condition control device includes a storage section for storing a heating value information related to respective heating values of the electronic apparatuses, and a controller for detecting that a fault has occurred in one of the air conditioners, specifying any of the electronic apparatuses which has been cooled by the one of the air conditioners having occurred the fault when the fault in the one of the air conditioners is detected, determining a heating value of each of the specified electronic apparatuses on the basis of the heating value information, and setting the air flow rate for at least one of the other air conditioners in accordance with the heating values of the specified electronic apparatuses.

11 Claims, 12 Drawing Sheets

FIG. 5

| AIR CONDITIONER ID | ASSIGNED IT APPARATUS ID |
|---|---|
| 1 | 1-1,1-2,1-3,1-4,2-1,2-2,2-3,2-4 |
| 2 | 3-1,3-2,3-3,3-4,4-1,4-2,4-3,4-4 |
| ⋮ | ⋮ |
| 6 | 5-4,5-5,5-6,5-7,6-4,6-5,6-6,6-7 |

AIR CONDITION CONTROL DEVICE AND CONTROLLING METHOD

CROSS-REFERENCE TO RELATED APPLICATION

This application is based upon and claims the benefit of priority of the prior Japanese Patent Application No. 2009-219742, filed on Sep. 24, 2009, the entire contents of which are incorporated herein by reference.

FIELD

The embodiments discussed herein are related to an air condition control device, an air condition controlling method, and a storage medium for storing an air condition controlling program.

BACKGROUND

Nowadays, a data center in which a plurality of racks on which respective electronic apparatuses such as servers, network equipment and the like are stacked are disposed is widely used. In a data center of the above mentioned type, an air conditioning system that blows off cooled air from air conditioners to cool the electronic apparatuses in order to bring down heat generated from the electronic apparatuses is utilized.

However, in the case that a fault has occurred in one air conditioner in a data center of the above mentioned type, in some cases, the fault-occurred air conditioner (the air conditioner in which the fault has occurred) may not blow off the cooled air to electronic apparatuses which have been cooled using the fault-occurred air conditioner so far. The temperature of each of the electronic apparatuses concerned may be increased and hence a malfunction may generate.

Therefore, as a technique for cooling electronic apparatuses which have been cooled using a fault-occurred air conditioner so far, a technique for setting a cooling capability of an air conditioner which works normally to an upper limit to cool the electronic apparatuses in place of the fault-occurred air conditioner is proposed. Specifically, in the case that a fault has occurred in one air conditioner, the flow rate at which a normally working air conditioner (an air conditioner which is working normally) blows off cooled air is set to a maximum value and the cooled air is supplied to the electronic apparatuses which have been cooled using the fault-occurred air conditioner so far.

However, in the above mentioned technique for cooling the electronic apparatuses using another air conditioner in the case that the fault has occurred in one air conditioner, the flow rate at which the normally working air conditioner blows off the cooled air is set to a maximum value out of consideration of a flow rate which is appropriate to cool the electronic apparatuses which have been cooled using the fault-occurred air conditioner so far.

As a result, the cooled air may be supplied to the electronic apparatuses which have been cooled using the fault-occurred air conditioner so far at an air flow rate which is higher than would be appropriate to cool the electronic apparatuses concerned and hence the whole inside of a data center may be cooled excessively. Therefore, such a problem may generate that in the case that a fault has occurred in one air conditioner, the power consumption of each of other normally working air conditioners is increased and hence effective cooling of the electronic apparatuses is not allowed accordingly.

The followings are reference documents.
[Patent Document 1] Japanese Laid-open Patent Publication No. 2006-118837
[Patent Document 2] Japanese Laid-open Patent Publication No. 2007-328633

SUMMARY

According to an aspect of the embodiment, an air condition control device for controlling a plurality of air conditioners which cool a plurality of electronic apparatuses respectively, the air condition control device includes a storage section for storing a heating value information related to respective heating values of the electronic apparatuses and a controller for detecting that a fault has occurred in one of the air conditioners, specifying any of the electronic apparatuses which has been cooled by the one of the air conditioners having occurred the fault when the fault in the one of the air conditioners is detected, determining a heating value of each of the specified electronic apparatuses on the basis of the heating value information, and setting the air flow rate for at least one of the other air conditioners in accordance with the heating values of the specified electronic apparatuses.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a diagram illustrating an example of a table which is stored in an assignment information storage unit (for storing respective IT apparatuses cooling of which are assigned to respective air conditioners);

DESCRIPTION OF EMBODIMENTS

Figure 1:
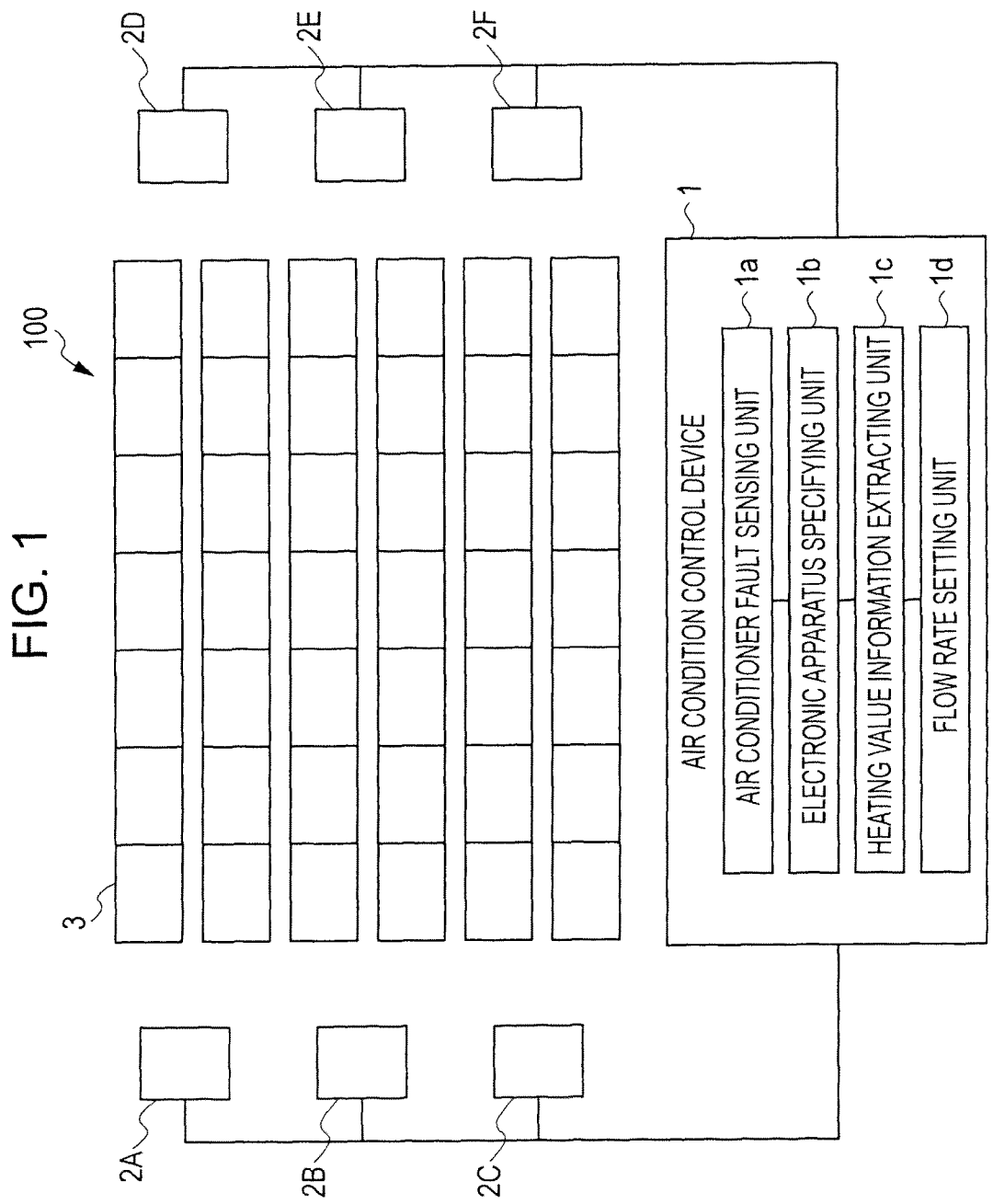
FIG. 1 is a block diagram illustrating an example of a configuration of an air conditioning system according to a first embodiment.

Preferred embodiments of the present techniques will be explained with reference to accompanying drawings.

Next, preferred embodiments of an air condition control device, an air condition controlling method and an air condition controlling program related to the technique disclosed in this specification will be described in detail with reference to the accompanying drawings.

[First Embodiment]

In an embodiment which will be described hereinbelow, a configuration of an air condition control device according to a first embodiment and a process performed using the air condition control device will be explained. An air conditioning system 100 includes the air condition control device 1, a plurality of air conditioners 2A to 2F and a plurality of electronic apparatuses 3.

The air condition control device 1 controls the air flow rate at which each of the air conditioners 2A to 2F blows off air. Each of the air conditioners 2A to 2F blows off cooled air to cool the electronic apparatuses 3. Cooled air that the air conditioners 2A to 2F have blown off is supplied to the plurality of electronic apparatuses. The air condition control device 1 according to the first embodiment includes an air conditioner fault sensing unit 1a, an electronic apparatus specifying unit 1b, a heating value information extracting unit 1c and an air flow rate setting unit 1d.

The air conditioner fault sensing unit is senses that a fault has occurred in one air conditioner. In the case that the fault has occurred in the air conditioner has been sensed using the air conditioner fault sensing unit 1a, the electronic apparatus specifying unit 1b specifies one or more electronic apparatuses to which the fault-occurred air conditioner has supplied the cooled air so far.

The heating value information extracting unit 1c extracts the heating value of each of the electronic apparatuses specified by the electronic apparatus specifying unit 1b from history information. The history information is recorded before the fault occurs in the air conditioner concerned. The air flow rate setting unit 1d sets the air flow rate of at least one of the other air conditioners in accordance with the extracted heating values of the electronic apparatuses using the heating value information extracting unit 1c.

As described above, the air condition control device 1 senses that the fault has occurred in the air conditioner and specifies the electronic apparatuses to which the fault-occurred air conditioner has supplied the cooled air so far in the case that occurrence of the fault has been sensed. Then, the air condition control device 1 extracts the heating value of each of the specified electronic apparatuses and sets the air flow rate of at least one of the other air conditioners in accordance with the extracted heating values of the electronic apparatuses.

That is, when one air conditioner has failed, the air condition control device 1 obtains an air flow rate which is appropriate for cooling from the heating values of the electronic apparatuses (e.g. IT (information technology) apparatuses) cooling of which is assigned to the fault-occurred air conditioner and allocates the air flow rate to each normally working air conditioner. Therefore, it may become possible to effectively cool the electronic apparatuses concerned while minimizing an increase in power consumption even when a fault has occurred in one air conditioner.

[Second Embodiment]

In an embodiment which will be described hereinbelow, a configuration of an air conditioning system according to a second embodiment and the flow of a process performed using the air conditioning system will be explained in order and effects brought about by the second embodiment will be explained finally. In the following second embodiment, an example of a data center that includes a bottom floor through which cooled air is supplied from air conditioners to racks will be described.

Figure 2:
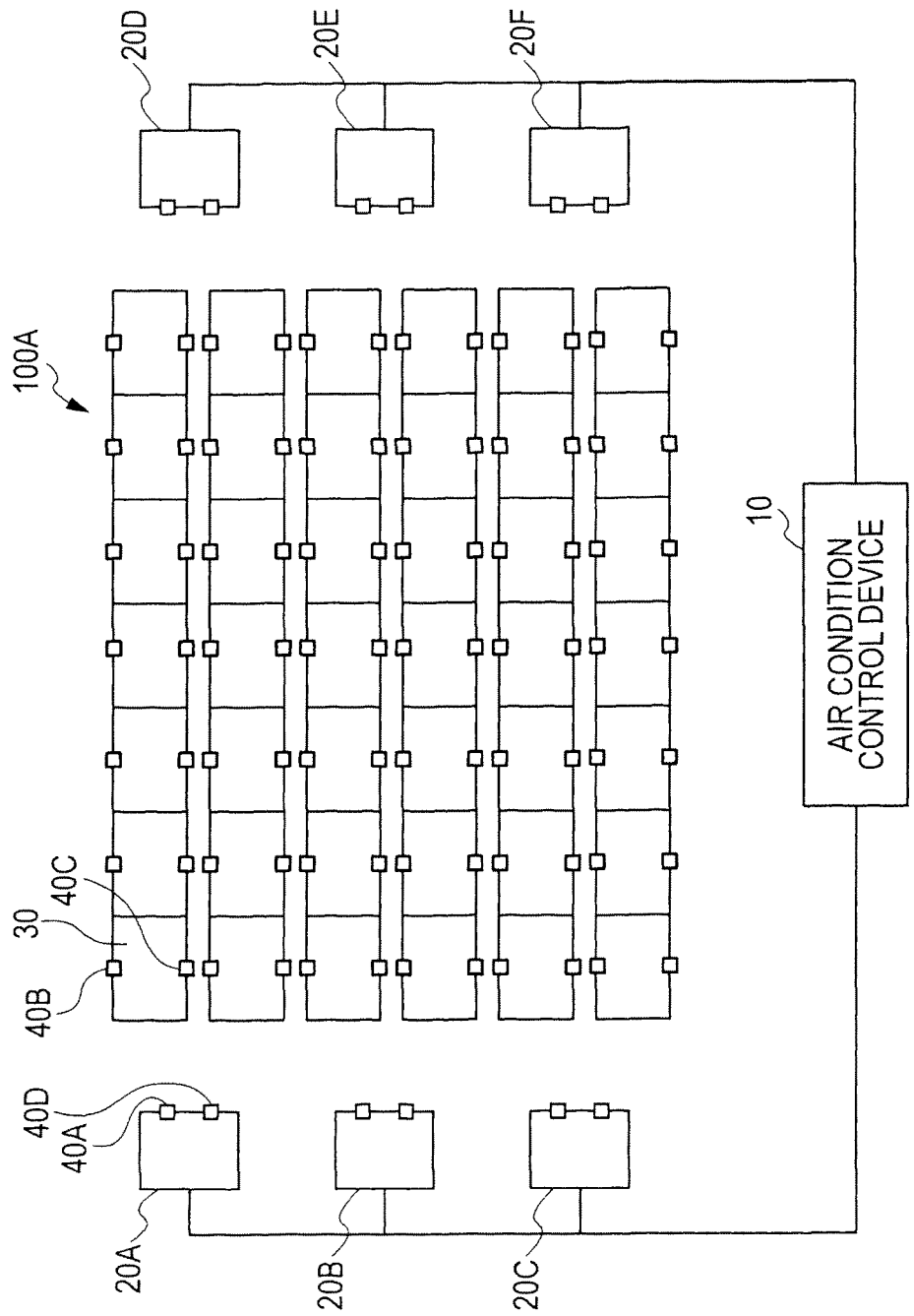
FIG. 2 is a block diagram illustrating an example of a configuration of an air conditioning system according to a second embodiment.

Next, a configuration of an air conditioning system 100A according to the second embodiment will be described with reference to FIG. 2. FIG. 2 is a block diagram illustrating an example of a configuration of the air conditioning system 100A according to the second embodiment. As illustrated in FIG. 2, the air conditioning system 100A includes an air condition control device 10, a plurality of air conditioners 20A to 20F and a plurality of racks 30.

The air conditioning system 100A also includes a plurality of air conditioner blow-off sensors (for respectively sensing cooled air which has been blown off from each of the air conditioners 20A to 20F) 40A and a plurality of air conditioner return sensors (for respectively sensing exhaust air which has been returned to each of the air conditioners 20 A to 20F) 40D. The air conditioner blow-off sensors 40A and air conditioner return sensors 40D are disposed on each of the air conditioners 20 A to 20F. The air conditioning system 100A also includes a plurality of rack supply-air sensors (for respectively sensing cooled air which has been supplied to each of the racks 30) 40B and a plurality of rack exhaust-air sensors (for respectively sensing air which has been exhausted from each of the racks 30) 40C. The rack supply-air sensors 40B and the rack exhaust-air sensors 40C are disposed on each of the racks 30. The air condition control device 10 is connected with the respective air conditioners 20A to 20F and the respective sensors 40A to 40D.

The air condition control device 10 acquires the blast temperature and the blast flow rate of each of the air conditioners 20A to 20F (the blast temperature and the blast flow rate at which each of the air conditioners 20A to 20F has blown off the cooled air) from the corresponding air conditioner blow-off sensor 40A. The air condition control device 10 acquires the supply-air temperature and the supply-air flow rate of each of IT apparatuses (the respective supply-air temperature and the respective supply-air flow rate at which the cooled air has been supplied to each of the IT apparatuses) from the corresponding rack supply-air sensors 40B. In addition, the air condition control device 10 acquires the exhaust-air temperature and the exhaust-air flow rate of each of the IT apparatuses (the respective exhaust-air temperature and the respective exhaust-air flow rate at which exhaust air has been exhausted from each of the IT apparatuses) from each of the rack exhaust-air sensors 40C. In addition, the air condition control device 10 acquires the respective intake-air temperature and the respective intake-air flow rate of each of the air conditioners 20A to 20F (the respective intake-air temperature and the respective intake-air flow rate at which the exhaust air has been taken into the each of air conditioners 20A to 20F) from the each of air conditioner return sensors 40D.

The air condition control device 10 transmits information related to setting of air conditioner performances to set the respective air conditioner performances to the corresponding air conditioners 20A to 20F. For example, the air condition control device 10 transmits blast flow rate data to instruct the corresponding air conditioner to increase the flow rate of cooled air.

Figure 3:
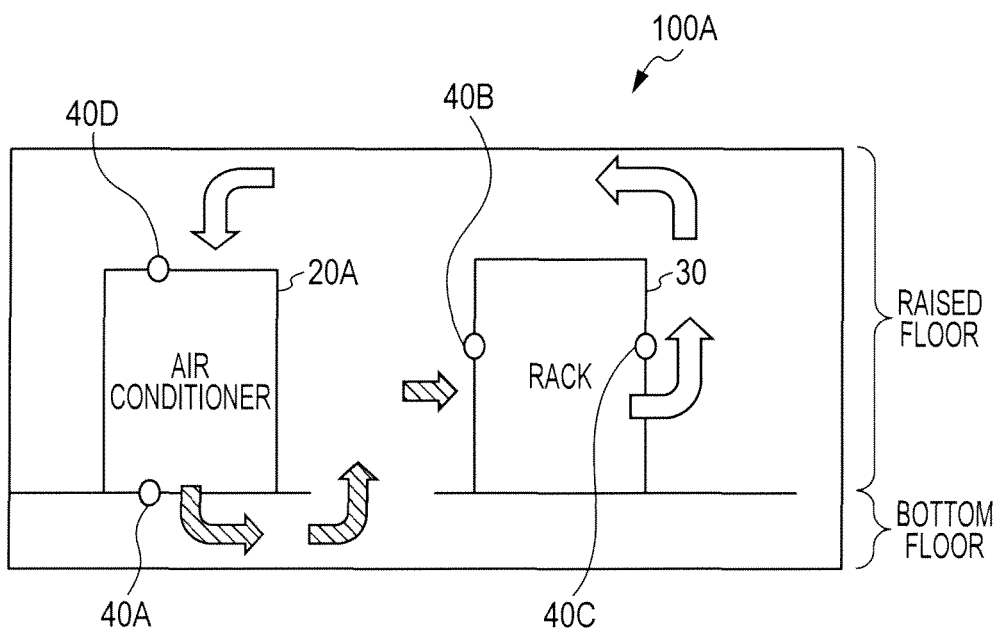
FIG. 3 is a diagram illustrating an example of flows of air circulating in the air conditioning system according to the second embodiment.

Next, circulation of air in the air conditioning system 100A according to the second embodiment will be described with reference to FIG. 3. FIG. 3 is a diagram illustrating an example of flows of air circulating in the air conditioning system 100A according to the second embodiment. As illustrated in the example in FIG. 3, the air conditioning system 100A is of a double bottom configuration including a bottom floor and a raised floor and the racks 30 are installed in the raised floor.

In the air conditioning system 100A, the cooled air which has been blown off from the air conditioner 20A down to the bottom floor is guided up to the raised floor and then supplied to the racks 30 as cold air. In FIG. 3, shaded arrows indicate the flow of the cooled air and white arrows indicate the flow of exhaust hot air.

The air conditioner 20A blows off the cooled air toward the rack 30 and takes therein the exhaust hot air which has been exhausted from the rack 30. Specifically, the air conditioner 20A blows off the cooled air down to the bottom floor to supply the cooled air to the rack 30 in the raised floor through a grill embedded in a floor face and takes therein the exhaust hot air that the rack 30 has exhausted into the raised floor.

In addition, the air conditioner 20A receives information related to setting of the air conditioner performance from the air condition control device 10 and the air conditioner performance of the air conditioner 20A is set in accordance with the received information related to setting of the air conditioner performance. For example, in the case that the air conditioner 20A has received blast flow rate data to instruct to increase the flow rate of the cooled air from the air condition control device 10, the air conditioner 20A sets to increase the blast flow rate. The rack 30 that mounts at least one of the IT apparatuses thereon takes therein the cooled air supplied from the air conditioner 20A and exhausts the exhaust hot air into the raised floor.

The air conditioner blow-off sensor 40A detects the blast temperature and the blast flow rate of each air conditioner 20A. The rack supply-air sensor 40B detects the supply air temperature and the supply-air flow rate of each of IT apparatuses mounted on the rack 30. The rack exhaust-air sensor 40C detects the exhaust-air temperature and the exhaust-air flow rate of each of IT apparatuses. The air conditioner return sensor 40D detects the intake-air temperature and the intake-air flow rate of each air conditioner 20A.

Figure 4:
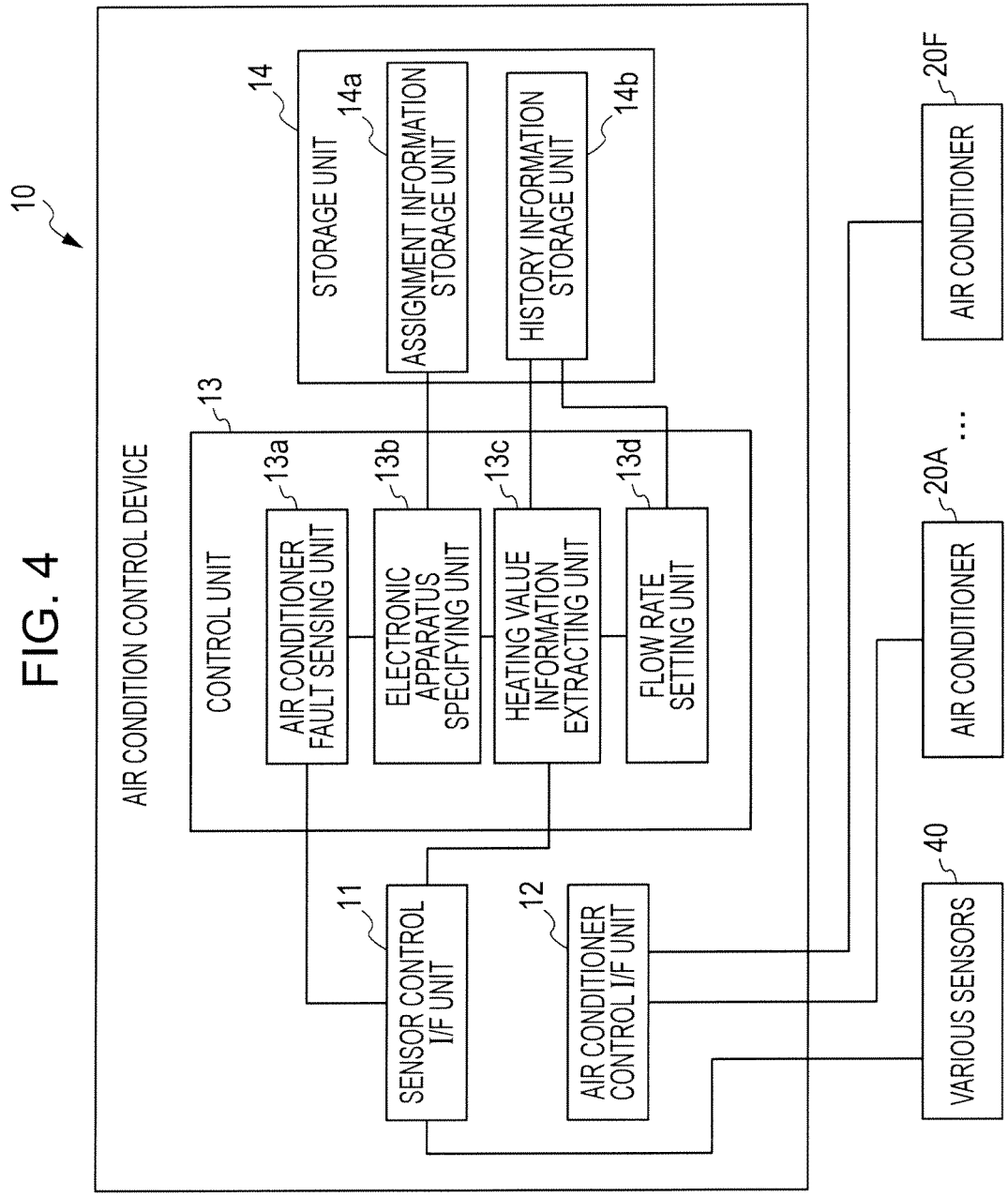
FIG. 4 is a block diagram illustrating an example of a configuration of an air condition control device according to the second embodiment.

Next, a detailed configuration of the air condition control device 10 will be described with reference to FIG. 4. FIG. 4 is a block diagram illustrating an example of a configuration of the air condition device 10 according to the second embodiment. As illustrated in FIG. 4, the air condition control device 10 includes a sensor control I/F unit 11, an air conditioner control I/F unit 12, a control unit 13 and a storage unit 14. Next, processes performed using these units will be described.

The sensor control I/F unit 11 controls communication related to various pieces of information to be transmitted to the various sensors 40 connected thereto and received from these sensors 40. Specifically, the sensor control I/F unit 11 acquires the blast temperature and the blast flow rate of each of the air conditioners 20A to 20F from the respective air conditioner blow-off sensors 40A. The sensor control I/F unit 11 acquires the supply-air temperature and the supply-air flow rate of each of IT apparatuses from the respective rack supply-air sensors 40B. The sensor control I/F unit 11 acquires the exhaust-air temperature and the exhaust-air flow rate of each of IT apparatuses from the respective rack exhaust-air sensors 40C. In addition, the sensor control I/F unit 11 acquires the intake-air temperature and the intake-air flow rate of each of the air conditioners 20A to 20F from the respective air conditioner return sensors 40D.

The air conditioner control I/F unit 12 controls communication related to various pieces of information to be transmitted from the air conditioners 20A to 20F which are connected thereto and to be received from the air conditioners 20A to 20F. Specifically, the air conditioner control I/F unit 12 transmits information related to setting of the air conditioner performances to the respective air conditioners 20A to 20F.

The storage unit 14 stores therein data and programs to be used to perform various processes using the control unit 13. The storage unit 14 is an example of a storage section, the control unit 13 is an example of a controller. In particular, the storage unit 14 includes an assignment information storage unit 14a and a history information storage unit 14b. The assignment information storage unit 14a stores information related to the IT apparatuses cooling of which are assigned to each of the air conditioners 20A to 20F. Specifically, as illustrated in an example in FIG. 5, the assignment information storage unit 14a stores therein a table which indicates "Air Conditioner ID" used to uniquely identify one air conditioner and "Assigned IT Apparatus ID" used to uniquely identify each of IT apparatuses cooling of which are assigned to each air conditioner in correspondence with one another.

The history information storage unit 14b stores therein measured values which have been acquired from the respective sensors 40 as history information. Specifically, the history information storage unit 14b stores therein the blast temperature of each air conditioner, the blast flow rate of each air conditioner, the supply-air temperature of each IT apparatus, the supply-air flow rate of each IT apparatus concerned, the exhaust-air temperature of each IT apparatus, the exhaust-air flow rate of each IT apparatus, the intake-air temperature of each air conditioner, the intake-air flow rate of each air conditioner, the temperature of blast through each grill (the blast temperature at which the cooled air has been blown off through each grill), the speed of blast through each grill (the blast speed at which the cooled air has been blown off through each grill), the power consumption of each IT apparatus and the like.

Figure 6:
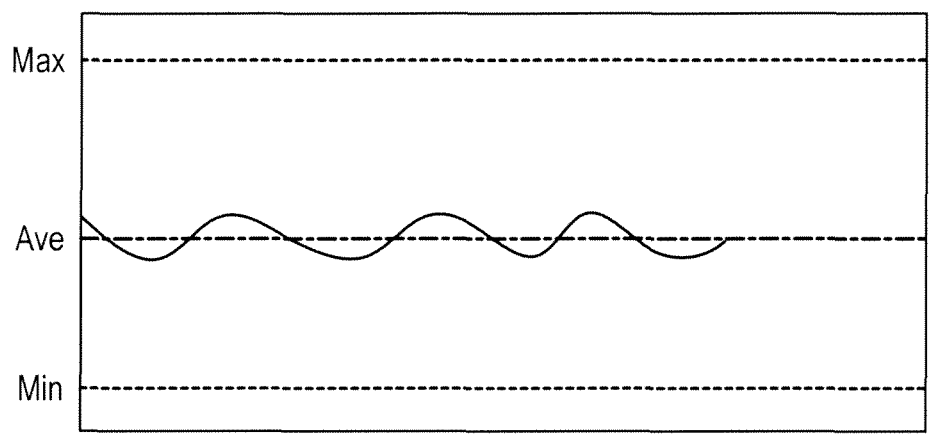
FIG. 6 is a diagram illustrating an example of a graph indicating measured values of a temperature at which air is supplied to each of IT apparatuses.

For example, as illustrated in an example in FIG. 6, the history information storage unit 14b stores values of the supply-air temperature of each IT apparatus which are measured in time series. As illustrated in FIG. 6, the history information storage unit 14b stores therein a maximum value "Max" and a minimum value "Min" of the values of the supply-air temperature of each IT apparatus which are recorded in its past history and an average value "Ave" of the values of the supply-air temperature of each IT apparatus which are recorded in its past history.

Figure 7:
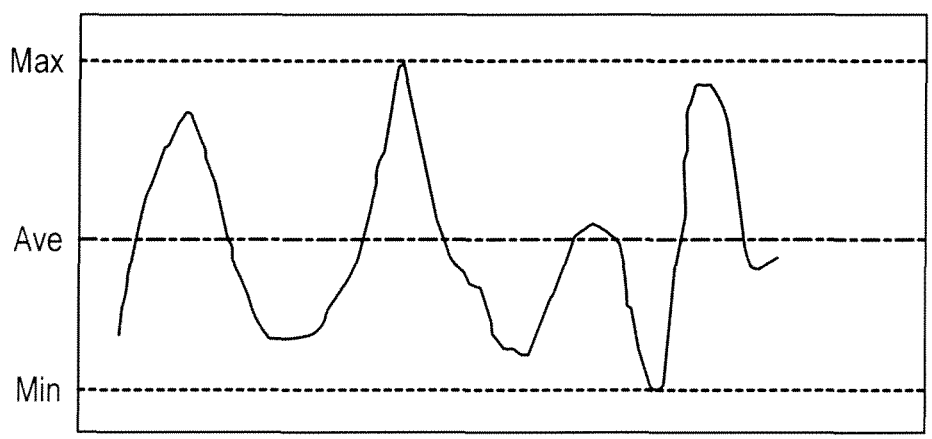
FIG. 7 is a diagram illustrating an example of a graph indicating measured values of a power consumption of each of IT apparatuses.

Likewise, as illustrated in an example in FIG. 7, the history information storage unit 14b stores values of the power consumption of each IT apparatus which are measured in time series. As illustrated in FIG. 7, the history information storage unit 14b stores therein a maximum value "Max" and a minimum value "Min" of the values of the power consumption of each IT apparatus which are recorded in its past history and an average value "Ave" of the values of the power consumption of each IT apparatus which are recorded in its past history.

The control unit 13 includes internal memories for storing programs and related data that define procedures of various processes and executes the various processes in accordance with the programs and data stored in the internal memories. In particular, the control unit 13 includes an air conditioner fault sensing unit 13a, an electronic apparatus specifying unit 13b, a heating value information extracting unit 13c and an air flow rate setting unit 13d.

The air conditioner fault sensing unit 13a senses that a fault has occurred in one air conditioner, for example, the air conditioner 20B. The air conditioner blow-off sensors 40A detect at predetermined time intervals. Specifically, the air conditioner fault sensing unit 13a acquires the blast flow rate of each of the air conditioners 20A to 20F from the history information storage unit 14b and judges whether there exist any air conditioner the current blast flow rate of which is "zero".

Then, in the case that it has been judged that there exists the air conditioner 20B the current blast flow rate of which is "zero", the air conditioner fault sensing unit 13a senses that the fault has occurred in the air conditioner 20B, judging from the fact that blast from the air conditioner 20B has abnormally stopped and transmits a notification that the fault has occurred in the air conditioner 20B to the electronic apparatus specifying unit 13b.

In the case that it has been sensed that the fault has occurred in the air conditioner 20B, the electronic apparatus specifying unit 13b specifies the rack 30 to which the air conditioner 20B has supplied the cooled air so far. Specifically, the electronic apparatus specifying unit 13b receives the notification that the fault has occurred in the air conditioner 20B from the air conditioner fault sensing unit 13a, reads the IT apparatuses cooling of which are assigned to the fault-occurred air conditioner 20B out of the assignment information storage unit 14a and notifies the heating value information extracting unit 13c of the read IT apparatuses.

Figure 8:
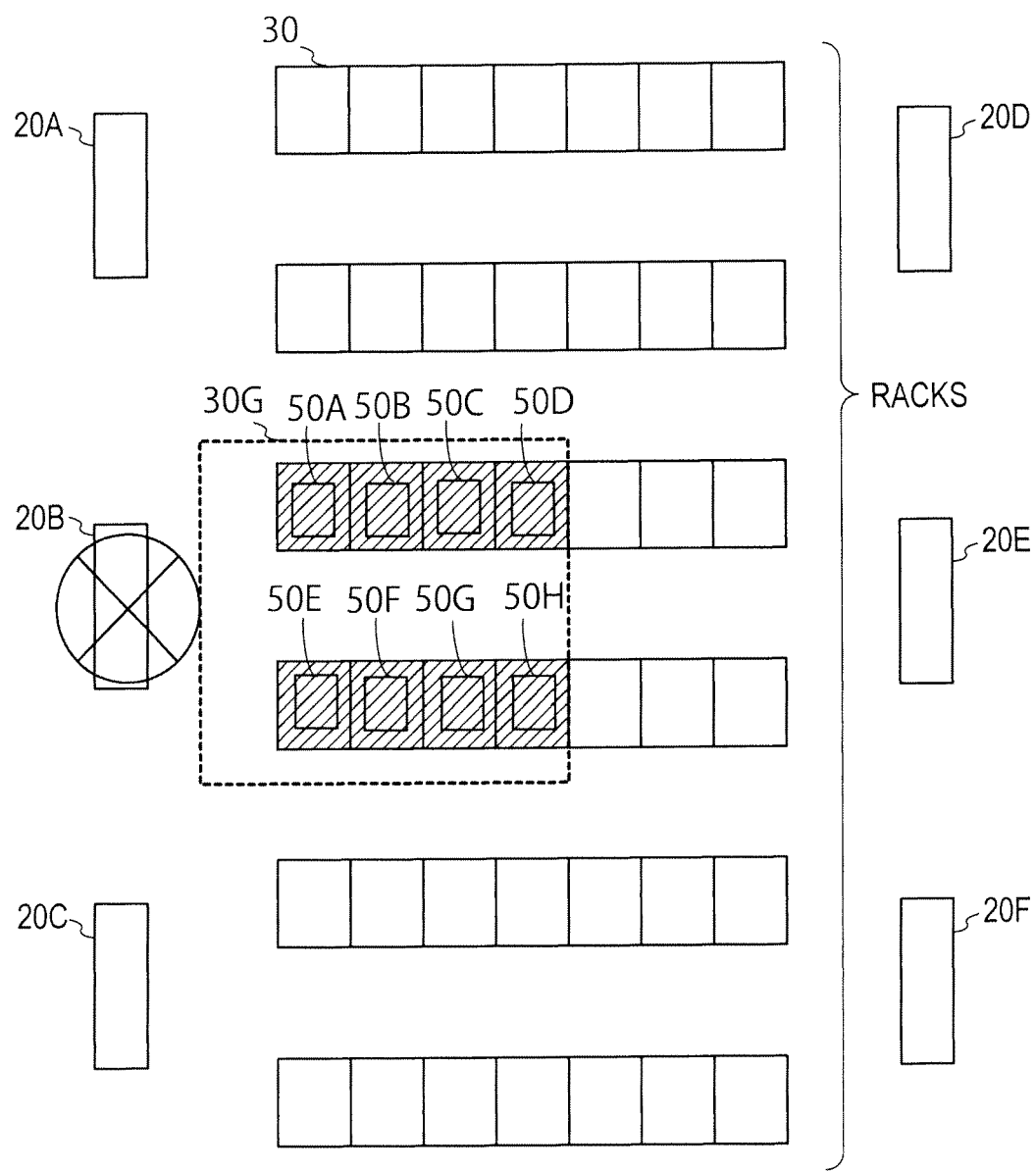
FIG. 8 is a diagram illustrating an example of IT apparatuses installed in an area cooling of which is assigned to a fault-occurred air conditioner.

For example, in an example of an air conditioning system illustrated in FIG. 8, racks which are vertically arrayed in six columns and racks which are horizontally arrayed in seven rows, that is, 42 racks in total are installed. FIG. 8 is a diagram illustrating an example of IT apparatuses installed in the area cooling of which is assigned to one air conditioner in which a fault has occurred. As illustrated in FIG. 8, in the case that a fault has occurred in an air conditioner 20B, the electronic apparatus specifying unit 13b reads the IT apparatuses cooling of which are assigned to the air conditioner 20B out of the assignment information storage unit 14a. The electronic apparatus specifying unit 13b specifies the IT apparatuses (such as the example illustrated in FIG. 8, "50A" to "50H") mounted on the racks 30 of a group 30G in the third and fourth columns and the first to fourth rows as the IT apparatuses cooling of which are assigned to the air conditioner 20B.

The heating value information extracting unit 13c extracts the heating value of the specified IT apparatuses 50A to 50H from the history information recorded before the fault occurs in the air conditioner 20B. Specifically, the heating value information extracting unit 13c reads the power consumption of each of the IT apparatuses 50A to 50H out of the history information storage unit 14b, sums up the power consumptions of the respective IT apparatuses 50A to 50H, and extracts a maximum value of summed-up values of the power consumptions of the respective IT apparatuses 50A to 50H. Then, the heating value information extracting unit 13c notifies the air flow rate setting unit 13d of the maximum value.

Figure 9:
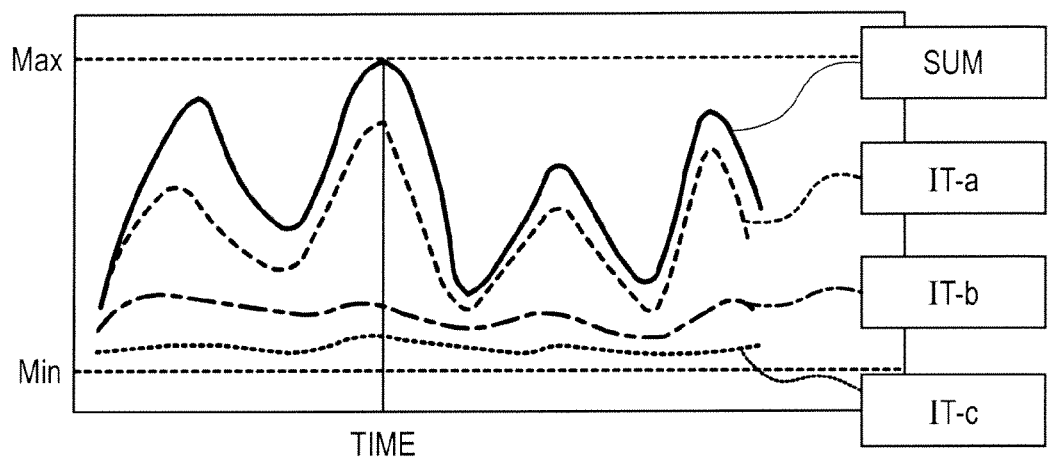
FIG. 9 is a diagram illustrating an example of a graph indicating time-series-based summed-up values of power consumptions of IT apparatuses installed in an area cooling of which is assigned to a fault-occurred air conditioner.

For example, as illustrated in an example in FIG. 9, the heating value information extracting unit 13c sums up the respective power consumptions of the IT apparatuses 50A to 50H (such as the example illustrated in FIG. 9, "IT-a", "IT-b" and "IT-c") cooling of which are assigned to the fault-occurred air conditioner 20B. Then, the heating value information extracting unit 13c extracts the maximum value (in the example illustrated in FIG. 9, "Max") of summed-up values of the power consumptions of the respective IT apparatuses.

The flow rate setting unit 13d sets the flow rates of air conditioners 20A, and 20C to 20F which are working normally in accordance with the extracted heating values of the IT apparatuses 50A to 50H. Specifically, the flow rate setting unit 13d sets a threshold value using the maximum value of the summed-up values of the power consumptions of the respective IT apparatuses 50A to 50H as the sum of the power consumptions which is appropriate to be used.

In addition, the flow rate setting unit 13d reads the power consumption of the respective IT apparatuses cooling of which are assigned to each of the normally working air conditioners 20A, and 20C to 20F out of the history information storage unit 14b. Then, the flow rate setting unit 13d determines the blast flow rate of each of the normally working air conditioners 20A, and 20C to 20F in accordance with the sum of the power consumptions of the respective IT apparatuses 50A to 50H cooling of which is assigned to the fault-occurred air conditioner 20B and the power consumptions of the respective IT apparatuses cooling of which is assigned to the normally working air conditioners 20A, and 20C to 20F.

That is, the flow rate setting unit 13d determines an appropriate flow rate of each normally working air conditioner from the power consumptions of the respective IT apparatuses in the area cooling of which is assigned to each of the normally working air conditioners 20A, and 20C to 20F. Then, the flow rate setting unit 13d determines the appropriate flow rate from the maximum power consumption in the past history of the IT apparatuses 50A to 50H in the area cooling of which is assigned to the fault-occurred air conditioner 20B and allocates the determined flow rate to each of normally working air conditioners 20A, and 20C to 20F.

In the above mentioned case, the flow rate setting unit 13d sets a threshold value of a supply-air flow rate which is appropriate to cool the IT apparatuses 50A to 50H, sets analysis conditions and repetitively performs a process of reflecting the set analysis conditions on an analysis model to determine the blast flow rate of each air conditioner, as a process of determining a flow rate which is appropriate for cooling the IT apparatuses 50A to 50H from the power consumption of each of the IT apparatuses 50A to 50H.

Next, the process of determining the flow rate which is appropriate for cooling the IT apparatuses 50A to 50H on the basis of the power consumption of each of IT apparatuses 50A to 50H will be described in detail. The flow rate setting unit 13d sets the "blast flow rate of each air conditioner (that is, each of air conditioners disposed in the vicinity of a fault-occurred air conditioner)", the "blast temperature of each air conditioner", the "aperture ratio of each grill (that is each of grills disposed in the vicinity of a fault-occurred air conditioner)", the "exhaust-air flow rate of each of IT apparatuses (that is, each of IT apparatuses in an area cooling of which has been assigned to a fault-occurred air conditioner so far)", the "heating value of each of IT apparatuses", and the "ventilation resistance on the bottom of each rack (that is, each rack on which the IT apparatuses concerned are mounted)" as the analysis conditions. Then, the flow rate setting unit 13d makes the analysis conditions so set reflect on the analysis model to acquire a result of analysis.

The flow rate setting unit 13d acquires, for example, the "blast temperature of each air conditioner", the blast flow rate of each air conditioner", the supply-air temperature of each of IT apparatuses", the "supply-air flow rate of each of IT apparatuses", the "exhaust-air temperature of each of IT apparatuses", the "exhaust-air flow rate of each of IT apparatuses", the intake-air temperature of each air conditioner", the "intake-air flow rate of each air conditioner", the "temperature of blast through each grill", the "speed of blast through each grill" and the "power consumption of each of IT apparatuses" as a result of analysis.

Then, the flow rate setting unit 13d judges whether the "supply-air flow rate of each of IT apparatuses" which has been acquired as the result of analysis is more than a threshold value. In the example illustrated in the drawing, an air flow rate which is appropriate for cooling the IT apparatuses and is obtained from the maximum power consumption of the IT apparatuses which is recorded in the past history is set for the IT apparatuses in the area cooling of which is assigned to the fault-occurred air conditioner as the threshold value.

Thus, in the case that the "supply-air flow rate of each IT apparatus" is not more than the threshold value, the flow rate setting unit 13d judges that the cooled air is not supplied to each IT apparatus at the flow rate which is appropriate for cooling the IT apparatuses, reviews the analysis conditions, sets a new analysis condition and makes the new analysis condition reflect on the analysis model. In the example illustrated in the drawing, the flow rate setting unit 13d increases the value of the "blast flow rate of each air conditioner" which is one of the analysis conditions, sets the value so increased as a new analysis condition and makes it reflect on the analysis model. Then, the flow rate setting unit 13d repeats a process of reviewing the analysis conditions until the "supply-air flow rate of each IT apparatus" obtained as each result of analysis becomes more than the threshold value.

In the case that it has been judged that the "supply-air flow rate of each IT apparatus" is more than the threshold value, the flow rate setting unit 13d judges that the cooled air is supplied to each IT apparatus at an air flow rate which is appropriate for cooling the IT apparatuses and determines the blast flow rate of the air conditioner which has been set as one of the analysis condition as an air flow rate which is appropriate for cooling the IT apparatuses with no generation of flowing of exhaust air around the rack from the result of analysis.

Figure 10:
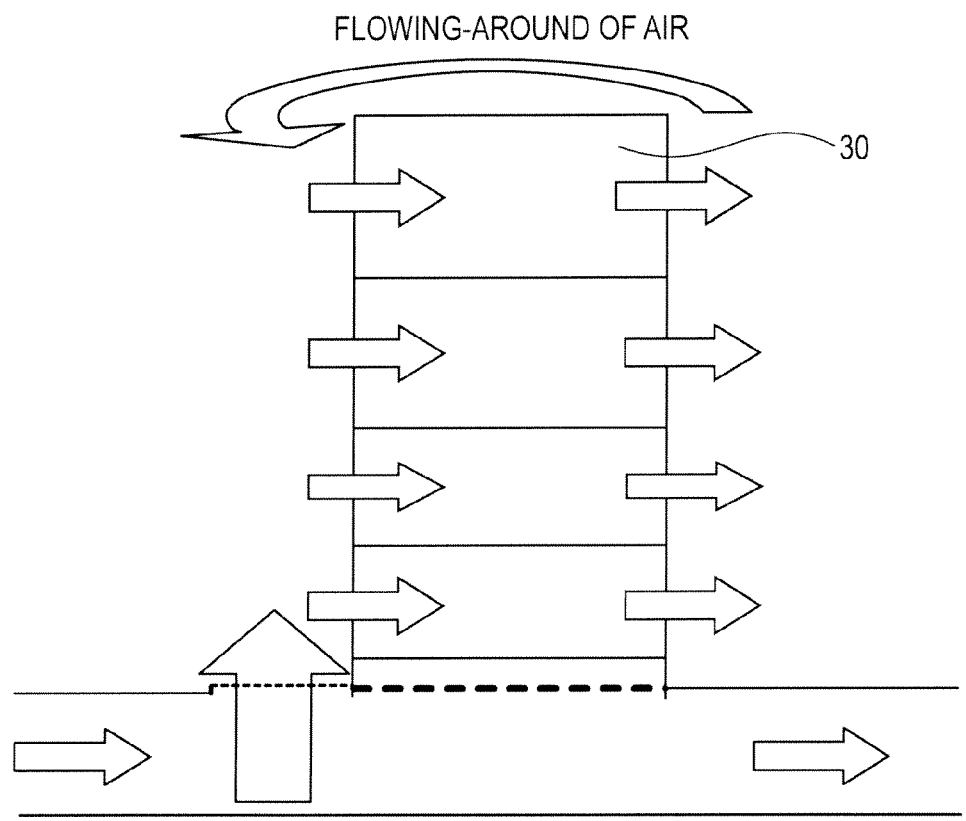
FIG. 10 is a diagram illustrating an example of flowing-around of air which would occur owing to an insufficient flow rate of cooled air.

Next, an example of flowing of exhaust air around the rack will be described with reference to FIG. 10. In many cases, flowing of the exhaust air around the rack will generate in the case that the amount of relatively cold cooled air supplied from one air conditioner in charge is insufficient to attain an appropriate flow rate of air which is used to cool the IT apparatuses 50A to 50H. For example, as illustrated in FIG. 10, in the case that the flow rate at which air is supplied to the rack concerned is insufficient, relatively hot air which is exhausted from itself or from adjacent racks is mixed into the cooled air to fill up insufficiency and hence the temperature at which air is supplied to the rack will be increased.

After the flow rate which is appropriate to cool the IT apparatuses 50A to 50H has been determined, the flow rate setting unit 13d transmits the determined blast flow rate to each of the normally working air conditioners 20A, and 20C to 20F as blast flow rate data to set the flow rate at which the cooled air is blown off from each of the air conditioners 20A, and 20C to 20F.

That is, when a fault has occurred in the air conditioner 20B to which cooling of the IT apparatuses has been assigned so far, the air condition control device 10 determines the blast flow rate, regarding the maximum value of the summed-up values of the power consumptions of respective IT apparatuses 50A to 50H which are recorded in the past history as the sum of power consumptions which will be used in the future, with consideration of a risk which would occur owing to a fluctuation in the heating value of each of the IT apparatuses 50A to 50H. As a result, it may become possible to appropriately cool the IT apparatuses 50A to 50H even when the total heating value of the IT apparatuses 50A to 50H cooling of which have been assigned to the fault-occurred air conditioner 20B so far has reached a maximum value on record.

Figure 11:
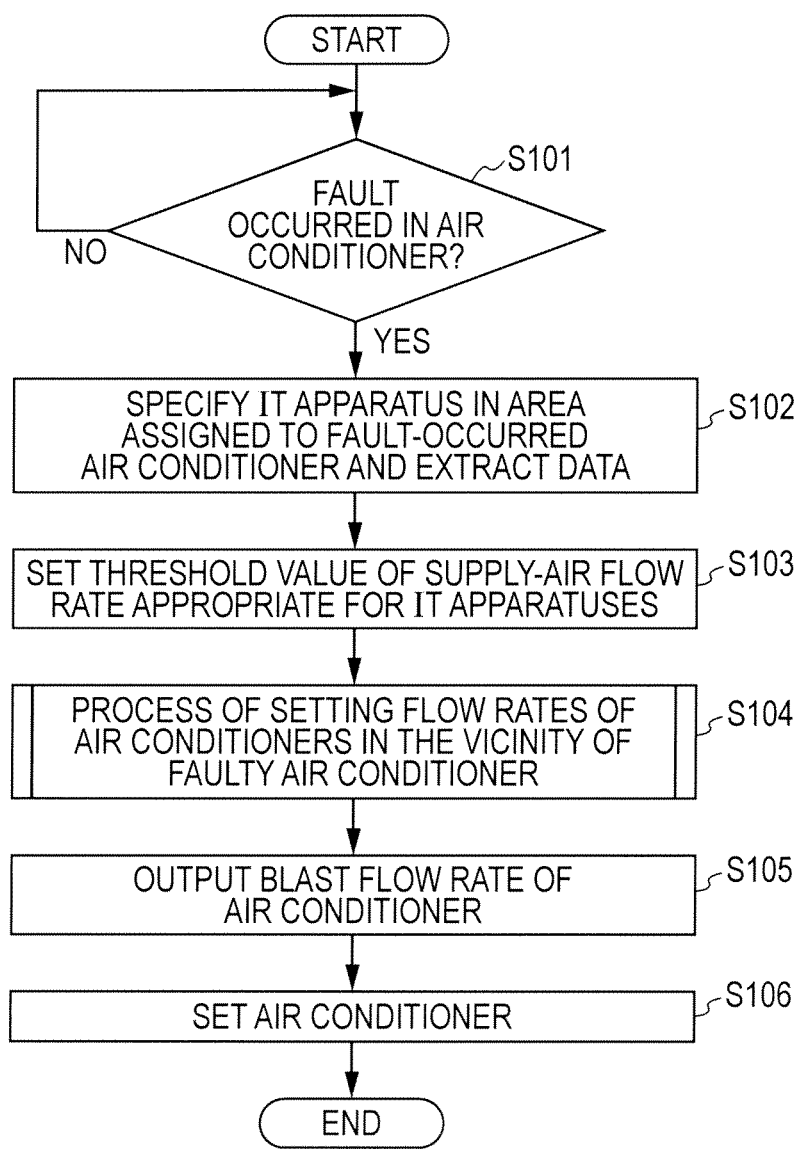
FIG. 11 is an example of a flowchart illustrating procedures of a process performed using an air condition control device 10a according to the second embodiment.
Figure 12:
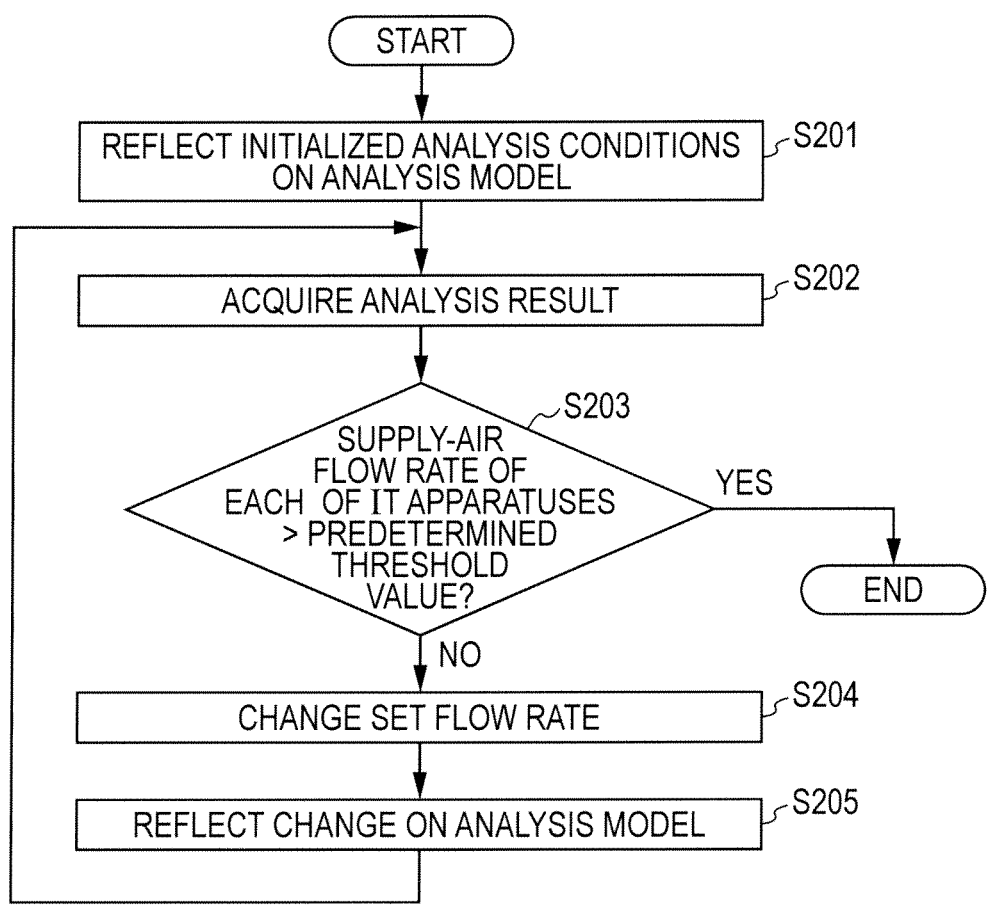
FIG. 12 is an example of a flowchart illustrating procedures of a process performed using the air condition control device 10a according to the second embodiment.

Next, processes performed using the air condition control device 10 according to the second embodiment will be described with reference to FIGS. 11 and 12. FIGS. 11 and 12 are flowcharts illustrating examples of processing operations of the air condition control device 10 according to the second embodiment.

As illustrated in FIG. 11, when it is detected that a fault has occurred in one air conditioner 20 (step S101, Yes), the air condition control device 10 specifies the IT apparatuses 50A to 50H in the area cooling of which have been assigned to the fault-occurred air conditioner 20B so far, and extracts data on power consumption of each of the specified IT apparatuses 50A to 50H in the group 30G of the racks 30 (step 102). Specifically, the air condition control device 10 extracts a maximum value of the summed-up values of the power consumptions of the respective IT apparatuses 50A to 50H which are recorded in the past history.

Then, the air condition control device 10 sets a threshold value of the supply-air flow rate which is appropriate to cool the IT apparatuses 50A to 50H in the group 30G (step S103). Specifically, the air condition control device 10 sets the threshold value of the supply-air flow rate which is appropriate to cool the IT apparatuses 50A to 50H in the area cooling of which have been assigned to the fault-occurred air conditioner 20B so far by using the maximum value of the summed-up values of the power consumptions of the respective IT apparatuses 50A to 50H which are recorded in the past history.

Then, the air condition control device 10 performs a process (which will be described in detail with reference to FIG. 12) of setting the blast flow rates of air conditioners 20A, and 20C to 20F which are disposed in the vicinity of the fault-occurred air conditioner 20B (step S104). Then, the air condition control device 10 outputs data on the blast flow rates to the normally working air conditioners 20A, and 20C to 20F (step S105) and sets the blast flow rates of the normally working air conditioners 20A, and 20C to 20F (step S106).

Next, a process of setting the blast flow rates of the air conditioners which are disposed in the vicinity of the fault-occurred air conditioner will be described with reference to FIG. 12. As illustrated in FIG. 12, first, the air condition control device 10 makes the analysis conditions which have been initialized reflect on an analysis model (step S201) and acquires a result of analysis (step S202).

Then, the air condition control device 10 judges whether the supply-air flow rate of each of the IT apparatuses 50A to 50H is more than a threshold value which has been set (step S203). As a result, in the case that the supply-air flow rate of each of the IT apparatuses 50A to 50H is not more than the threshold value (step S203, No), the air condition control device 10 judges that air is not supplied to each of the IT apparatuses 50A to 50H at an appropriate flow rate, and changes the value of the air flow rate which has been set as one of the analysis conditions (step S204) and makes the changed air flow rate reflect on the analysis model (step S205).

Then, the process returns to step 202 and the air condition control device 10 acquires another result of analysis and repeats a process of reviewing the analysis conditions until each of the supply-air flow rates of the respective IT apparatuses 50A to 50H which are obtained from each result of analysis becomes more than the threshold value (step S202 to Step S205).

On the other hand, in the case that it has been judged that the supply-air flow rate of each of the IT apparatuses 50A to 50H is more than the threshold value (step S203, Yes), the air condition control device 10 determines the blast flow rate of the air conditioner which is set as one of the analysis conditions as the air flow rate which is appropriate to cool the IT apparatuses 50A to 50H and terminates execution of the process.

As described above, the air condition control device 10 detects that a fault has occurred in one air conditioner and specifies IT apparatuses 50A to 50H to which the air conditioner has supplied cooled air so far when it has been sensed that the fault has occurred in the air conditioner 20B. Then, the air condition control device 10 extracts the heating value of each of the IT apparatuses 50A to 50H so specified and sets the flow rates of other normally working air conditioners 20A, and 20C to 20F in accordance with the extracted heating values of the specified IT apparatuses 50A to 50H. Therefore, even when the fault has occurred in the air conditioner 20B in charge, it may become possible to effectively cool the IT apparatuses 50A to 50H concerned while minimizing an increase in power consumption.

In addition, according to the second embodiment, a heating value which is the highest in the heating values which have been stored in history information before the fault occurs in the air conditioner in charge is extracted as the heating value of each of the specified IT apparatuses 50A to 50H. Thus, it may become possible to appropriately cool the IT apparatuses 50A to 50H concerned with consideration of a risk which would occur owing to a fluctuation in the heating value of each of IT apparatuses.

Further, according to the second embodiment, the power consumption of the specified IT apparatus is extracted as the heating value of the IT apparatus itself. Therefore, it may become possible to grasp the heating value of the IT apparatus itself by utilizing the power consumption of the IT apparatus.

Still further, according to the second embodiment, the air flow rates of air conditioners which are disposed in the vicinity of the fault-occurred air conditioner are set in accordance with the extracted heating values of the IT apparatuses, so that it may become possible to effectively cool the IT apparatuses by setting the flow rates of the air conditioners which are disposed near the IT apparatuses cooling of which have been assigned to the fault-occurred air conditioner so far.

[Third Embodiment]

The embodiments of the present technique have been described hereinabove. However, the present technique is not limited to the above mentioned embodiments and may be embodied in a variety of ways. Thus, in the following, a further embodiment which is included in the present technique will be described as a third embodiment.

In the second embodiment, the example in which the air flow rate of each air conditioner is set has been described as one example of setting the air conditioner performance. However, this embodiment is not limited to the above mentioned setting and setting of the blast temperature of each air conditioner, setting of the aperture ratio of each grill, setting of the exhaust-air flow rate of each of IT apparatuses and setting of the heating value of each of IT apparatuses may be performed in addition to performance of setting of the flow rate of each of the air conditioners concerned.

Figure 13:
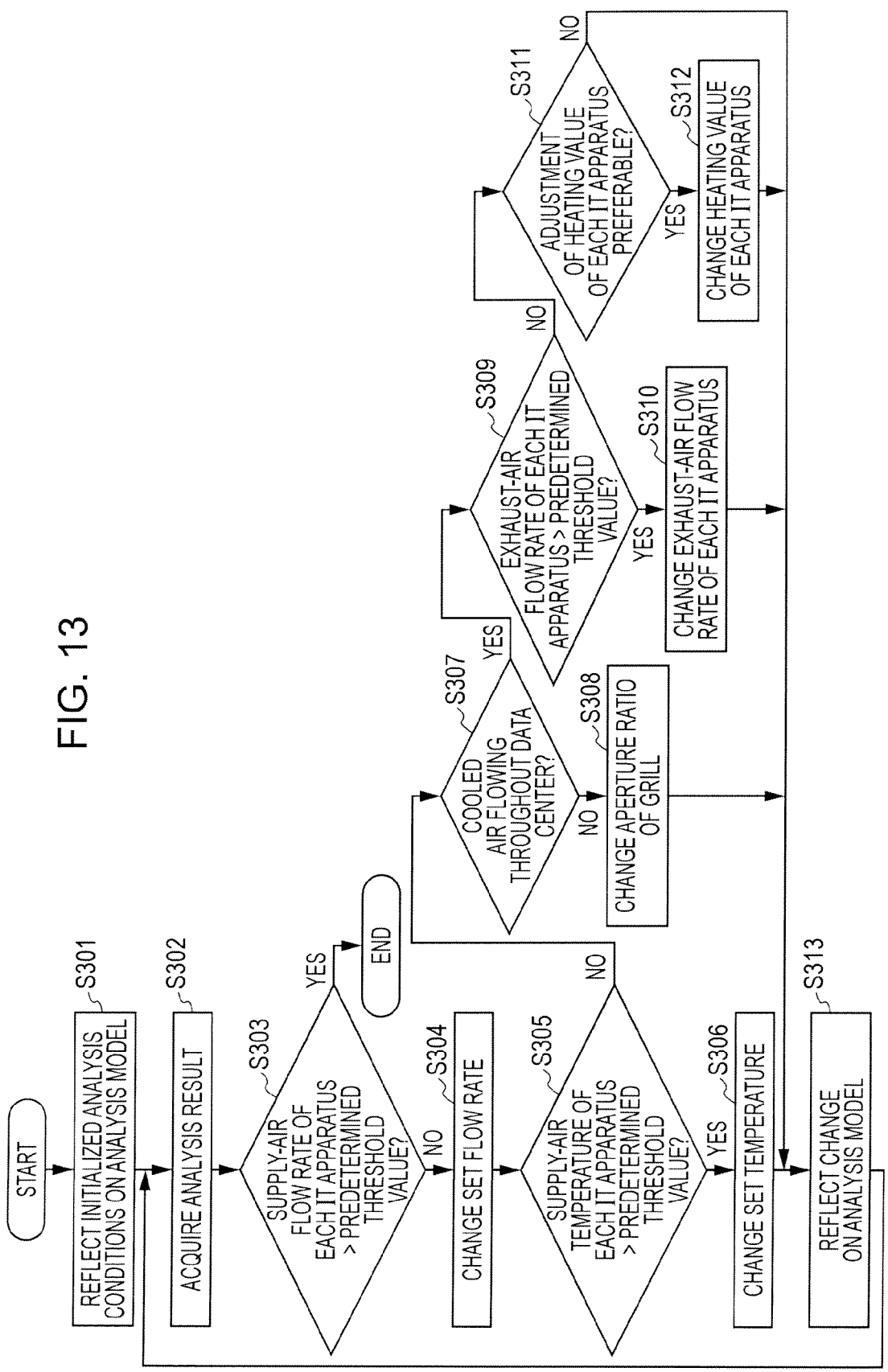
FIG. 13 is an example of a flowchart illustrating procedures of a process performed using an air condition control device according to a third embodiment.

Next, a process of setting the air conditioner performance of the air conditioner concerned will be specifically described with reference to FIG. 13. Incidentally, description of the processes which are the same as those in the second embodiment will be omitted. As illustrated in FIG. 13, the air condition control device 10 makes the analysis conditions which are set by initialization reflect on the analysis model, acquires the result of analysis and judges whether the supply-air flow rate of each IT apparatus is more than the set threshold value (step S301 to step S303) as in the case in the second embodiment.

Then, in the case that the supply-air flow rate of each IT apparatus is not more than the threshold value (step S303, No), the air condition control device 10 changes setting of the analysis condition related to the blast flow rate of each of the air conditioners which are disposed in the vicinity of the fault-occurred air conditioner (step S304) and judges whether the supply-air temperature of each IT apparatus is more than the threshold value (step S305). In the case that the supply-air temperature of each IT apparatus is more than the threshold value (step S305, Yes), the air condition control device 10 changes the blast temperature of the air conditioner which is one of the analysis conditions to a lower value (step S306).

On the other hand, in the case that the supply-air temperature of each IT apparatus is not more than the threshold value (step S305, No), the air condition control device 10 refers to the speed at which the cooled air is blown off through each grill to judge whether the cooled air flows throughout the data center (step S307). As a result of judgment, in the case that the cooled air does not flow throughout the data center (step S307, No), the air condition control device 10 changes the aperture rate of each grill (step S308).

On the other hand, in the case that the cooled air flows throughout the data center (step S307, Yes), the air condition control device 10 judges whether the exhaust-air flow rate of each IT apparatus is more than a predetermined threshold value (step S309). As a result of judgment, in the case that the exhaust-air flow rate of each IT apparatus is more than the predetermined threshold value (step S309, Yes), the air condition control device 10 changes the exhaust-air flow rate of each IT apparatus to a lower value (step S310).

On the other hand, in the case that the exhaust-air flow rate of each IT apparatus is not more than the predetermined threshold value (step S309, No), the air condition control device 10 judges whether adjustment of the heating value of each IT apparatus is preferable (step S311). As a result, in the case that it has been judged that adjustment of the heating value of each IT apparatus is preferable (step S311, Yes), the air condition control device 10 changes the heating value of each IT apparatus (step S312).

Then, after setting of the flow rate of each air conditioner, setting of the blast temperature of each air conditioner, setting of the aperture ratio of each grill, setting of the exhaust-air flow rate of each IT apparatus or setting of the heating value of each IT apparatus has been changed, the air condition control device 10 makes the setting so changed reflect on the analysis model (step S313).

Then, the process returns to step S302 and the air condition control device 10 acquires another result of analysis and repeats a process of reviewing the analysis conditions until each of supply-air flow rates of respective IT apparatuses which is obtained from each result of analysis becomes more than the threshold value. As a result, in the case that it has been judged that the supply-air flow rate of each IT apparatus is more than the threshold value (step S303, Yes), the air condition control device 10 determines the blast flow rate of the air conditioner which is set as one of the analysis conditions as a flow rate which is appropriate to cool the IT apparatuses and terminates execution of the process.

As described above, it may become possible to appropriately cool the IT apparatuses cooling of which have been assigned to the fault-occurred air conditioner so far by performing setting of the blast temperature of each air conditioner, setting of the aperture ratio of each grill, setting of the exhaust-air flow rate of each of IT apparatuses or setting of the heating value of each of IT apparatuses, in addition to performance of setting of the flow rate of each air conditioner.

Incidentally, constitutional elements included in respective devices illustrated in the drawings are mere conceptual ones in function and need not necessarily be physically configured as illustrated in the drawings. That is, specific forms obtained by distributing and/or integrating respective devices are not limited to those illustrated in the drawings and all or a part of these devices may be configured by being functionally and/or physically distributed and/or integrated in arbitrary units in accordance with various loads exerted thereon and situations in which these devices are used. For example, the air conditioner fault sensing unit 13a may be integrated with the electronic apparatus specifying unit 13b. In addition, all or an arbitrary part of processing functions performed using respective devices may be implemented using a CPU and a program which is analyzed and executed using the CPU or may be implemented in the form of hardware which is configured using a wired logic.

Figure 14:
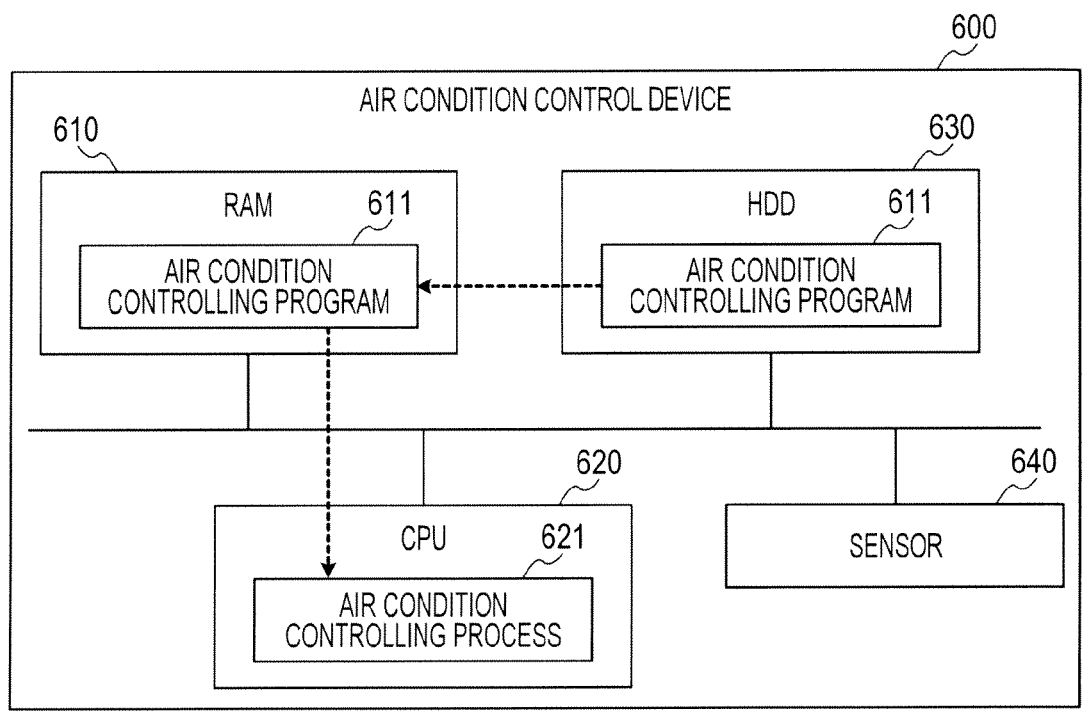
FIG. 14 is a diagram illustrating an example of a computer that executes an air condition controlling program.

In addition, the respective processes which have been described in the first and second embodiments may be implemented by executing a program which is prepared in advance using a computer system such as a personal computer, a workstation or the like. Thus, in the following, an example of a computer that executes an air condition controlling program having the same function as the configurations described in relation to the first and second embodiments will be described with reference to FIG. 14. FIG. 14 is a diagram illustrating an example of a computer that executes an air condition controlling program as mentioned above.

As illustrated in FIG. 14, a computer 600 serving as an air condition control device includes a RAM 610, a CPU 620, an HDD 630 and a sensor 640 which are connected with one another via a bus or the like.

The HDD 630 stores therein information which is used to execute various processes using the CPU 620. The RAM 610 temporarily stores therein various pieces of information. The CPU 620 executes various arithmetic processing operations.

An air condition controlling program 611 which exhibits the same functions as respective processing units of an interrupt controller as installed in the devices which have been described in the first and second embodiments is stored in advance in the HDD 630 as illustrated in FIG. 14. As an alternative, the air condition controlling program 611 may be appropriately distributed to be stored in storage units of other computers which are connected to communicate with the computer 600 illustrated in FIG. 14 via a network.

Then, the CPU 620 reads the air condition controlling program 611 out of the HDD 630 and expands the program in the RAM 610. Then, in accordance with the air condition controlling program 611, various pieces of data are read out of the HDD 630 and are expanded in areas which are allocated to the data in the RAM 610 and various processes are executed on the basis of the data and the like so expanded.

Incidentally, the air condition controlling program 611 may not necessarily be stored in advance in the HDD and may be stored and executed in such a manner that respective programs included in the air condition controlling program 611 are stored in, for example, "portable physical media" such as flexible disks (FDs), CD-ROMs, DVD disks, magneto-optical disks, IC cards and the like which are inserted into the computer 600 and "other computers (or servers)" and the like which are connected with the computer 600 via a public line, Internet, a LAN, a WAN and the like and the computer 600 reads the programs out of the above mentioned media and/or computers (servers) and executes the read programs.

Owing to the above mentioned configuration, according to one aspect of the air condition control device disclosed in the embodiments, such an effect may be obtained that even when a fault has occurred in one air conditioner, electronic apparatuses may be effectively cooled using other air conditioners while minimizing an increase in power consumption.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An air condition control device for controlling a plurality of air conditioners which cool a plurality of electronic apparatuses respectively, the air condition control device comprising:
   a storage section for storing a heating value information related to respective heating values of the electronic apparatuses; and
   a controller for detecting that a fault has occurred in one of the air conditioners, specifying any of the electronic apparatuses which has been cooled by the one of the air conditioners having occurred the fault when the fault in the one of the air conditioners is detected, determining a heating value of each of the specified electronic apparatuses on the basis of the heating value information, and setting the air flow rate for at least one of the other air conditioners in accordance with the heating values of the specified electronic apparatuses.

2. The air condition control device according to claim 1, wherein the heating value information includes history information before the fault occurs in the specified air conditioner, and the controller determines the highest heating value on the basis of the history information as the heating value of each of the specified electronic apparatuses.

3. The air condition control device according to claim 1, wherein the controller determines power consumption of each of the specified electronic apparatuses as the heating value.

4. The air condition control device according to claim 2, wherein the controller determines power consumption of each of the specified electronic apparatuses as the heating value.

5. The air condition control device according to claim 1, wherein the controller sets the air flow rate for at least one of the air conditioners which are disposed in the vicinity of the fault-occurred air conditioner in accordance with the heating values of the specified electronic apparatuses.

6. An air condition controlling method for controlling a plurality of air conditioners which cool a plurality of electronic apparatuses respectively, the air condition controlling method comprising:
   detecting that a fault has occurred in one of the air conditioners by a controller;
   specifying, by the controller, any of the electronic apparatuses which has been cooled by the one of the air conditioners having occurred the fault when the fault in the one of the air conditioners is detected;

determining a heating value of each of the specified electronic apparatuses by the controller on the basis of the heating value information; and setting the air flow rate for at least one of the other air conditioners by the controller in accordance with the heating values of the specified electronic apparatuses.

7. The air condition controlling method according to claim 6, wherein the heating value information includes history information before the fault occurs in the specified air conditioner, and the controller determines the highest heating value on the basis of the history information as the heating value of the specified electronic apparatuses.

8. The air condition controlling method according to claim 6, further comprising:

determining power consumption of each of the specified electronic apparatuses as the heating value by the controller.

9. The air condition controlling method according to claim 7, further comprising:

determining power consumption of each of the specified electronic apparatuses as the heating value by the controller.

10. The air condition controlling method according to claim 6, further comprising:

setting the air flow rate for at least one of the air conditioners which are disposed in the vicinity of the fault-occurred air conditioner by the controller in accordance with the heating values of the specified electronic apparatuses.

11. A storage medium storing an air condition controlling program for controlling a plurality of air conditioners which cool electronic apparatuses respectively, the air condition controlling program allowing a controller of a computer to execute an operation, the operation comprising:

detecting that a fault has occurred in one of the air conditioners by a controller;

specifying, by the controller, any of the electronic apparatuses which has been cooled by the one of the air conditioners having occurred the fault when the fault in the one of the air conditioners is detected;

determining a heating value of each of the specified electronic apparatuses by the controller on the basis of the heating value information; and setting the air flow rate for at least one of the other air conditioners by the controller in accordance with the heating values of the specified electronic apparatuses.

* * * * *